(12) United States Patent
Caldwell

(10) Patent No.: US 6,496,374 B1
(45) Date of Patent: Dec. 17, 2002

(54) APPARATUS SUITABLE FOR MOUNTING AN INTEGRATED CIRCUIT

(75) Inventor: Barry Caldwell, Hesston, KS (US)

(73) Assignee: LSI Logic Corporation, Milpitas, CA (US)

(*) Notice: Subject to any disclaimer, the term of this patent is extended or adjusted under 35 U.S.C. 154(b) by 27 days.

(21) Appl. No.: 09/695,540

(22) Filed: Oct. 24, 2000

(51) Int. Cl.[7] .................................. H05K 7/20
(52) U.S. Cl. .................. 361/709; 361/704; 361/707; 165/80.3; 165/185; 257/706; 257/709
(58) Field of Search .................. 361/704, 707, 361/709, 717–719, 807, 809, 816–819, 702–703, 690, 696, 722; 165/80.2, 80.3, 80.4, 165, 185; 257/706–727; 174/16.3, 35 R; 911/516, 522, 523; 248/316.7, 510; 24/457, 520, 458, 695

(56) References Cited

U.S. PATENT DOCUMENTS

| | | | | |
|---|---|---|---|---|
| 3,946,276 A | * | 3/1976 | Braun et al. | 317/100 |
| 5,241,453 A | * | 8/1993 | Bright et al. | 361/704 |
| 5,357,404 A | * | 10/1994 | Bright et al. | 361/818 |
| 5,504,652 A | * | 4/1996 | Foster et al. | 361/704 |
| 5,566,052 A | * | 10/1996 | Hughes | 361/704 |
| 5,586,005 A | * | 12/1996 | Cipolla et al. | 361/710 |
| 5,805,430 A | * | 9/1998 | Atwood et al. | 361/829 |
| 5,978,229 A | * | 11/1999 | Kim | 361/704 |
| 5,985,697 A | * | 11/1999 | Chaney et al. | 438/122 |
| 6,075,699 A | * | 6/2000 | Rife | 361/704 |
| 6,078,500 A | * | 6/2000 | Beaman et al. | 361/704 |
| 6,205,026 B1 | * | 3/2001 | Wong et al. | 361/704 |
| 6,208,515 B1 | * | 3/2001 | Klein | 361/704 |
| 6,293,331 B1 | * | 9/2001 | Wang | 165/80.3 |
| 6,392,887 B1 | * | 5/2002 | Day et al. | 361/704 |

* cited by examiner

Primary Examiner—Darren Schuberg
Assistant Examiner—Michael Datskovsky
(74) Attorney, Agent, or Firm—Suiter & Associates PC

(57) ABSTRACT

The present invention is directed to an apparatus suitable for mounting an integrated circuit (IC) including a frame suitable for receiving an integrated circuit (IC). The frame includes at least one leg coupled to the frame, the leg suitable for engaging a circuit board so as to enable the apparatus to be secured to the circuit board, thereby securing the integrated circuit (IC). At least one of the frame and leg include a conductive material so as to create at least one of a heat conducting path and an EMC ground path between the integrated circuit (IC) and the circuit board.

25 Claims, 8 Drawing Sheets

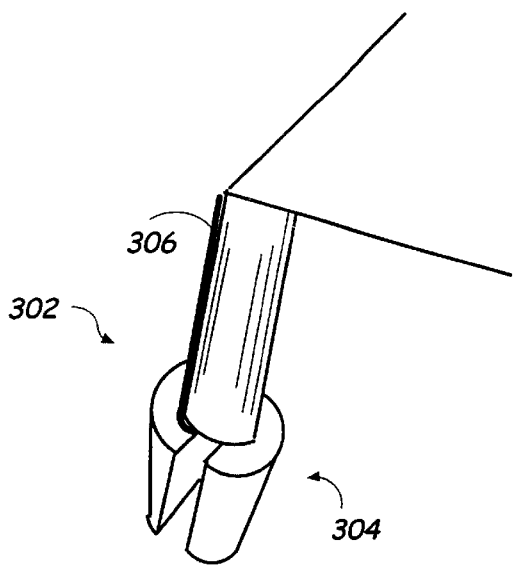
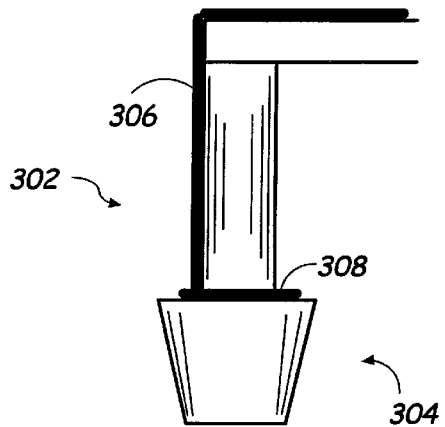
FIG. 3A    FIG. 3B
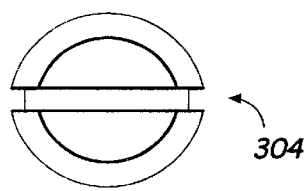
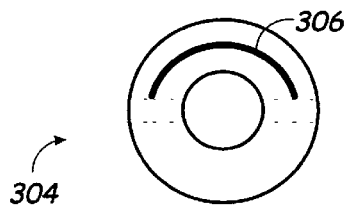
FIG. 3C    FIG. 3D

APPARATUS SUITABLE FOR MOUNTING AN INTEGRATED CIRCUIT

FIELD OF THE INVENTION

The present invention generally relates to the field of integrated circuit mounting assemblies, and particularly to an apparatus suitable for mounting an integrated circuit.

BACKGROUND OF THE INVENTION

Electronics packaging and assembly has helped to great improve modem life. From wireless telephones to electronic organizers, information handling systems, and the like, integrated circuits (IC) included in these devices make great advances possible. To achieve these advances, the integrated circuits (IC) must be mounted in the desired device in an efficient manner to provide the full capabilities of the circuit.

For example, the ball grid array (BGA) form factor is a chip carrier wherein an integrated circuit (IC) is provided to a next assembly level, such as a circuit board, by an array of solder balls that connect the integrated circuit (IC) to the circuit board. Ball grid array (BGA) packages provide high interconnect density and lead count using standard pitch dimensions, and may accommodate flip-chip and wire-bond interconnections between the die and the solder balls in a basic structure of plastic, ceramic, tape, metal and the like. However, there are no current methods available to hold ball grid arrays to circuit boards in a prototype stage and production that will not interfere with heat sink and EMC shielding which are easy to attach to a printed circuit board (PCB) and have a low cost to produce.

SUMMARY OF THE INVENTION

Accordingly, the present invention is directed to a mounting device for an integrated circuit. The mounting device of the present invention may provide an inexpensive mounting device with a variety of options for chip retention, spring action, EMC shielding characteristics, ease of attachment of heat sinks and the like. In a first aspect of the present invention, an apparatus suitable for mounting an integrated circuit (IC) includes a frame suitable for receiving an integrated circuit (IC). The frame includes at least one leg coupled to the frame, the leg suitable for engaging a circuit board so as to enable the apparatus to be secured to the circuit board, thereby securing the integrated circuit (IC). At least one of the frame and leg include a conductive material so as to create at least one of a heat conducting path and an EMC coupling/ground path between the integrated circuit (IC) and the circuit board.

In a second aspect of the present invention, an apparatus suitable for mounting an integrated circuit to a circuit board includes a frame suitable for receiving the integrated circuit (IC), the frame including at least one leg coupled to the frame. The leg is suitable for engaging a circuit board so as to enable the apparatus to be secured to the circuit board, thereby securing the integrated circuit (IC). A pressure device is connected to the frame, the pressure device suitable for biasing the integrated circuit to the circuit board wherein the pressure device and leg include a conductive material to provide an EMC coupling/ground path between the integrated circuit (IC) and the circuit board.

In a third aspect of the present invention, an apparatus suitable for mounting an integrated circuit to a circuit board includes a frame suitable for receiving the integrated circuit (IC). The frame is suitable for engaging a circuit board so as to enable the apparatus to be secured to the circuit board, thereby securing the integrated circuit (IC). A pressure device is connected to the frame. The pressure device is suitable for biasing the integrated circuit to the circuit board wherein the pressure device and frame include a conductive material to provide at least one of an EMC coupling/ground path and a heat conductive path between the integrated circuit (IC) and the circuit board.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIGS. 3A, 3B, 3C, 3D, 3E and 3F are illustrations of exemplary leg structures of the present invention;

DETAILED DESCRIPTION OF THE INVENTION

Reference will now be made in detail to the presently preferred embodiments of the invention, examples of which are illustrated in the accompanying drawings.

Referring generally now to FIGS. 1 through 8B, exemplary embodiments of the present invention are shown. An integrated circuit (IC), configured in a ball grid array (BGA) form factor, such as super or "cavity-down" ball grid array (SBGA), plastic ball grid array (PBGA), rectangular plastic ball grid array (Rectangular PBGA) and the like, is shown for discussion purposes, it should be apparent that a wide variety of integrated circuit (IC) form factors are contemplated by the present invention without departing from the spirit and scope thereof.

Figure 1:
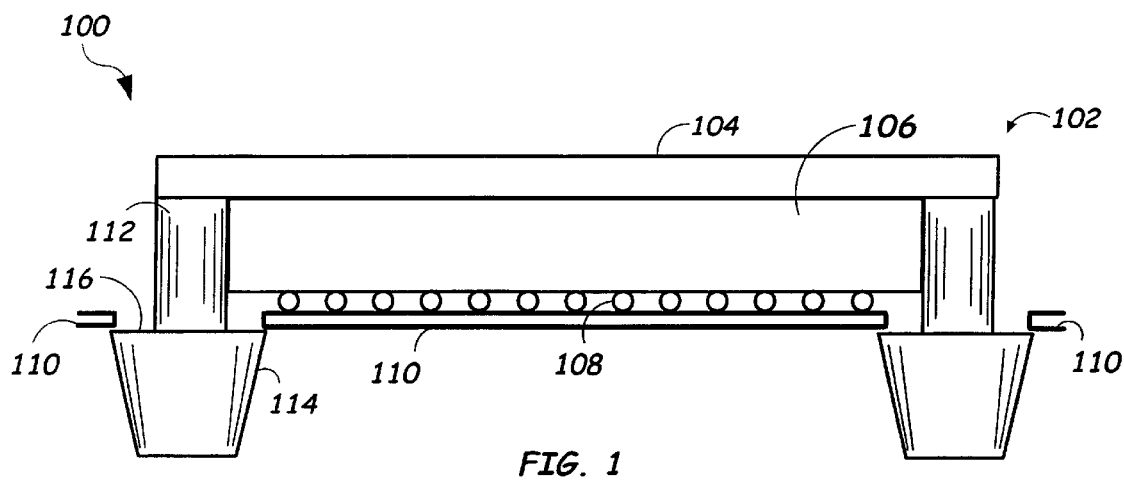
FIG. 1 is a side view of an exemplary embodiment of the present invention wherein an apparatus of the present invention is utilized to mount an integrated circuit configured in a ball grid array form factor to a circuit board.

Referring now to FIG. 1, an exemplary embodiment 100 of the present invention is shown wherein an apparatus of the present invention is utilized to mount an integrated circuit (IC) configured in a ball grid array form factor to a circuit board. A mounting device 102 includes a frame 104 suitable for receiving an integrated circuit (IC) 106. The integrated circuit 106 may include an array of solder balls 108 to contact an electrical signal trace pad included on a circuit board 110. The mounting device 102 includes a leg 112 coupled to the frame 104 to secure the mounting device 102 to the circuit board 110. The leg 112 includes a foot 114 that is suitable for being inserted through a plated or non-plated hole 116 in the circuit board 110. In this manner, the foot "snaps" into the hole 116 of the circuit board to provide efficient installation of the mounting device 102 to the circuit board 110

Preferably, the mounting device is formed to secure the integrated circuit so as to prevent damage to the circuit and provide a constant connection. For example, as shown in the embodiment 200 illustrated in FIG. 2A, a bottom view of an integrated circuit is shown, the integrated circuit secured in an exemplary mounting device. A mounting device 202 includes a frame 204 to secure an integrated circuit (IC) to a circuit board 210. The frame 204 is configured to generally surround the integrated circuit to prevent movement of the circuit. The frame includes a plurality of legs 212 to secure the mounting device 202 to the circuit board 210, thereby securing the integrated circuit 206 between the mounting device 202 and the circuit board 210.

Figure 2A:
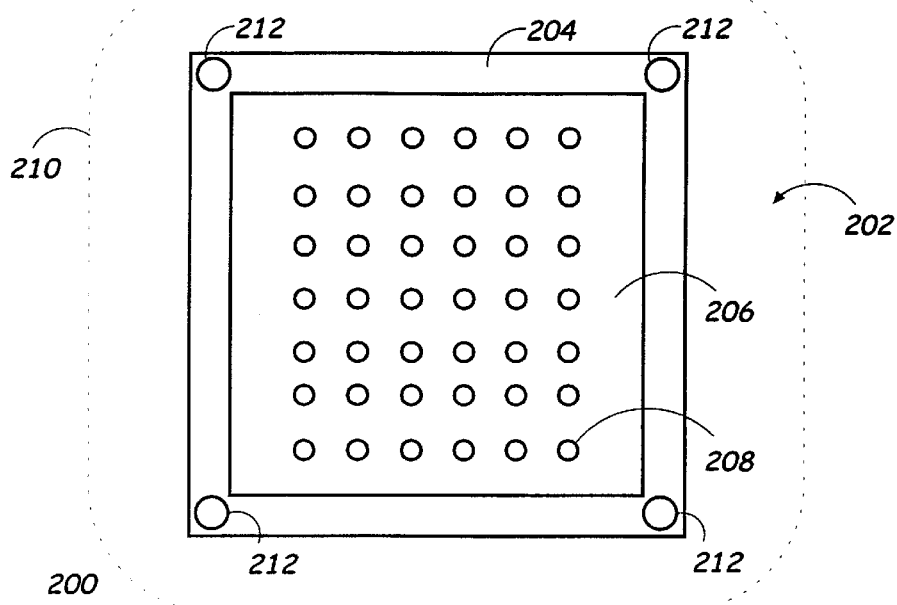
FIG. 2A is a bottom view of the exemplary embodiment shown in FIG. 1, wherein the integrated circuit secured in an exemplary mounting device.
Figure 2B:
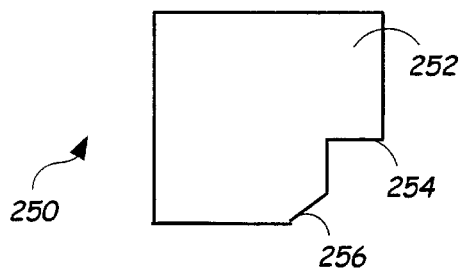
FIG. 2B is a cross-sectional view of the exemplary embodiment shown in FIG. 1, wherein a frame of a mounting device is shaped to guide and hold an integrated circuit in place.

Referring now to FIG. 2B, a cross section view of an exemplary embodiment 250 is shown wherein a frame of a mounting device is shaped to guide and hold an integrated circuit in place. A frame 252 includes a notch indention 254, which in this instance is rectangular in shape, extending around the inner bottom circumference of the frame 252 to hold the integrated circuit in place with tight precision. A chamfer 256 may also be included to guide the placement of the integrated circuit into the notch indention 254 around the bottom of the frame 252. Alignment posts may also be included for tight precision placement of the frame for correct alignment of the integrated circuit solder balls on the signal trace pads, as shown in FIG. 1.

Referring generally now to FIGS. 3A, 3B, 3C and 3D, exemplary leg structures of the present invention are shown. A leg 302 may include a foot 304 with a split-tapered point, as shown in the isometric illustration FIG. 3A, the bottom view of the foot in FIG. 3C, and the top view of the foot shown in FIG. 3D. The foot 304 is suitable for insertion through a hole 116 in a circuit board 110 (FIG. 1). The leg 302 includes an embedded conductive material 306 trace or wire, which may be included on the surface of the leg 302. The conductive material 306 forms a conduction path from a top of the snap-in retention foot 304, as shown in FIG. 3D, up the side of the leg 302, as shown in FIG. 3B. The conductive material 306 may include copper, a conductive polymer and the like as contemplated by a person of ordinary skill in the art.

Figure 3E:
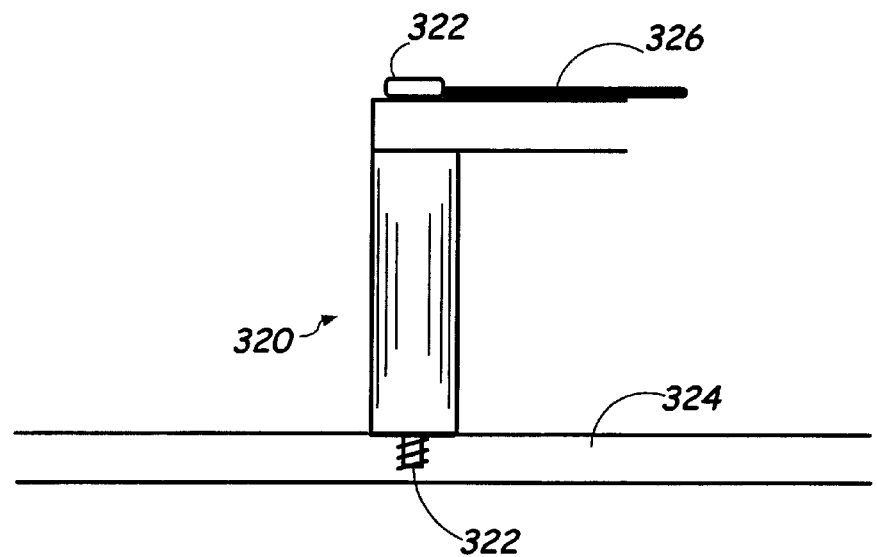
Figure 3F:
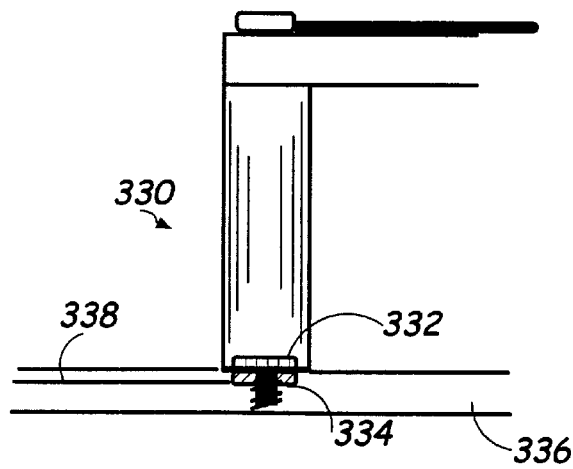

The leg structure may be formed in a variety of ways without departing from the spirit and scope of the present invention. For example, as shown in FIG. 3E, the leg structure 320 may include a screw 322 for mounting to a circuit board 324. Preferably, the screw 322 contacts conductive material 326 to form a conductive path between an indicated circuit to the circuit board. Additionally, as shown in FIG. 3F, the leg structure 330 may be formed so that the bottom of the leg would have a conductive wire or surface covering 332 that would press against a conduction surface 334 on the circuit board 336. Preferably, the conduction surface 334 would be connected 338 to the circuit board's ground plane or current return path for high frequency designs.

Figure 4:
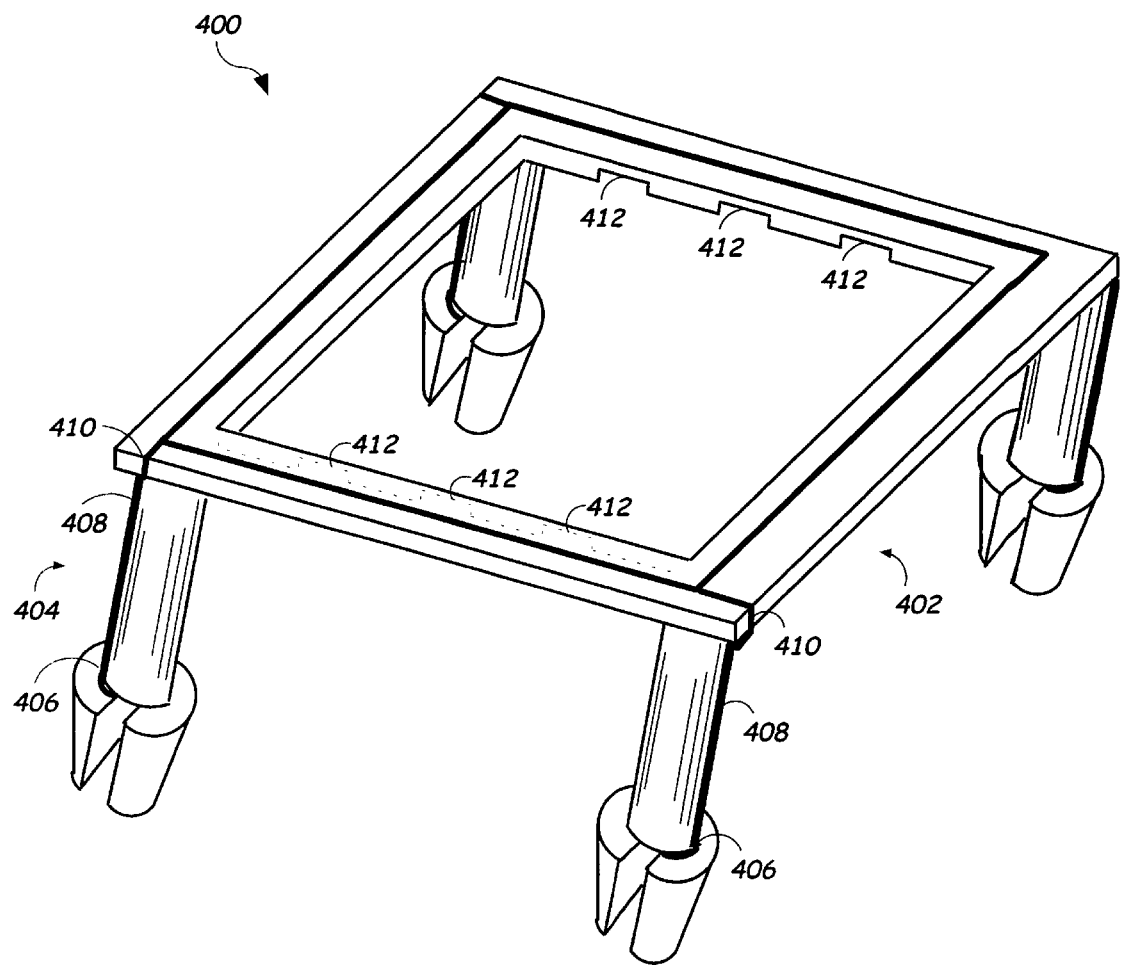
FIG. 4 is an isometric drawing of an exemplary embodiment of the present invention wherein a mounting device includes a conductive material suitable for providing a conductive path for at least one of EMC ground path and heat conduction path.

Referring now to FIG. 4, an exemplary embodiment 400 of the present invention is shown wherein a mounting device includes a conductive material suitable for providing a conductive path for at least one of EMC coupling/ground path and heat conduction path. A mounting device 402 includes conductive material 404 disposed from the foot 406 up the side of the leg 408 continuing up the frame 410 to a receptacle 412. The conductive material 404 is disposed in the receptacle 412 so as to provide contact with a pressure device, as will be discussed in conjunction with FIGS. 5A through 6C. Thus, the conductive material 404 provides an EMC current conduction path/ground path. This construction feature may create a Faraday cage effect to contain radiated EMI emissions from high frequency clocks included inside of an integrated circuit.

Figure 5A:
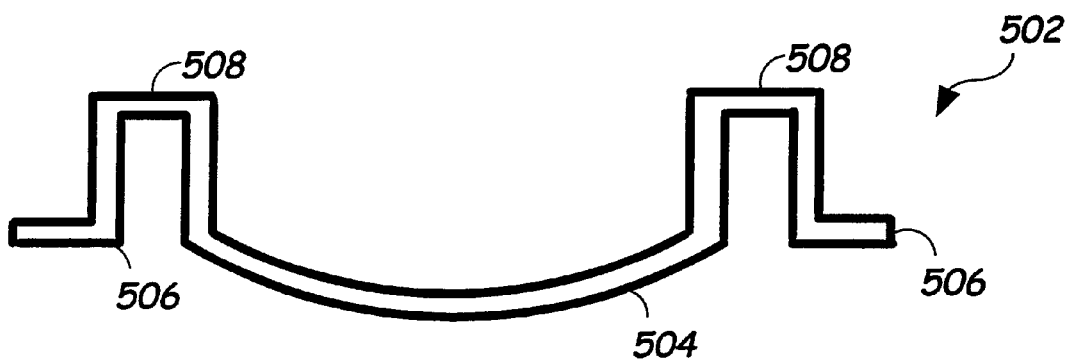
FIGS. 5A and 5B are illustrations of exemplary embodiments of the present invention wherein a side view and a bottom view of a pressure device configured as a spring pressure clip is shown.
Figure 5B:
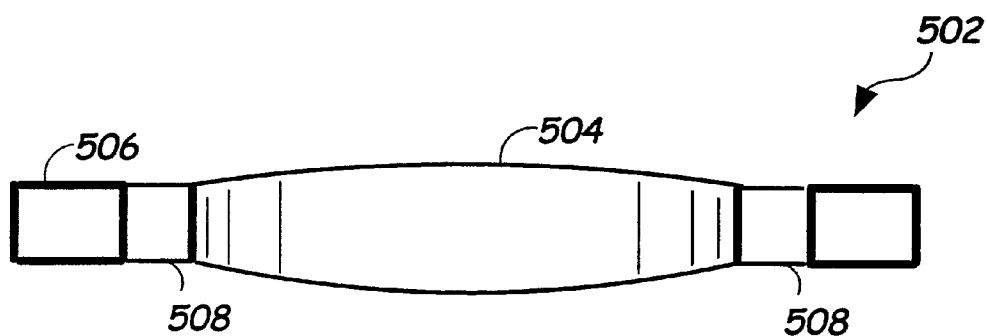

Referring generally now to FIGS. 5A and 5B, an exemplary embodiment of the present invention is shown wherein a pressure device is configured as a spring pressure clip. A pressure device 502 may be used to apply pressure to the top of a ball grid array (BGA) chip package to bias the solder balls on the package into electrical mechanical contact with electrical signal trace pads on the circuit board, as shown in FIG. 1. Preferably, the pressure device 502 is formed of a conductive material to continue the conductive path shown in FIG. 4 to create an EMC current conduction path/ground path, although the pressure device may be formed out of other materials to supply mechanical pressure as desired. The pressure device 502 may include a contact surface 504 to provide an area to promote electrical mechanical contact with the integrated circuit. The pressure device may also include tabs 506 suitable for being inserted into the receptacles 412 (FIG. 4). Thus, a plurality of pressure devices may be utilized in the frame to provide mechanical pressure and/or electrical conduction.

Additionally, a spring action feature 508 may also be included to provide additional mechanical pressure to the integrated circuit. Although the spring action feature 508 shown is rectangular in shape, a variety of configurations are contemplated by the present invention without departing from the spirit and scope thereof. Receptacles suitable for receiving a pressure device may be formed in a variety of ways without departing from the spirit and scope of the present invention, such as arched, triangular, and the like.

Figure 6A:
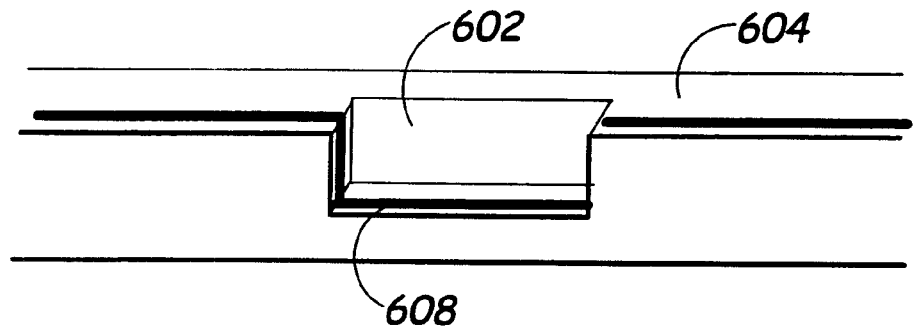
FIGS. 6A, 6B and 6C are illustrations of exemplary receptacles of the present invention.

Referring now to FIG. 6A, a bottom view of an exemplary receptacle of the present invention is shown. A receptacle 602 is formed as a slot in the underside of a frame 604 suitable for receiving a pressure device tab 504 (FIGS. 5A and 5B). Conductive material 606 is disposed in the receptacle 602 to provide electro-mechanical contact with a pressure device, thereby providing an EMC current conduction path/ground path and/or a heat conduction path. Thus, to install the mounting device, the pressure device and integrated circuit would both be assembled into the frame and then the mounting assembly would be snapped into place on the circuit board.

Figure 6B:
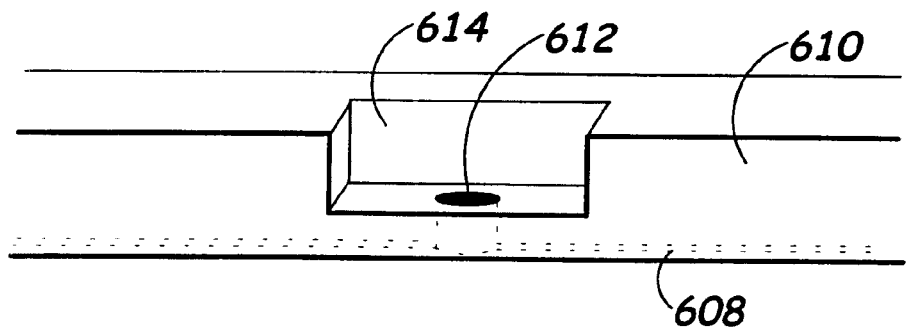

Conductive material may also be inserted down into the receptacle, as shown in the bottom view of an exemplary frame shown in FIG. 6B. In this example, conductive material 608, disposed on the topside of a frame 610, is inserted through the frame 610 to provide a contact point 612 in the receptacle 614 to provide electro-mechanical contact between the pressure device and the conductive material.

Figure 6C:
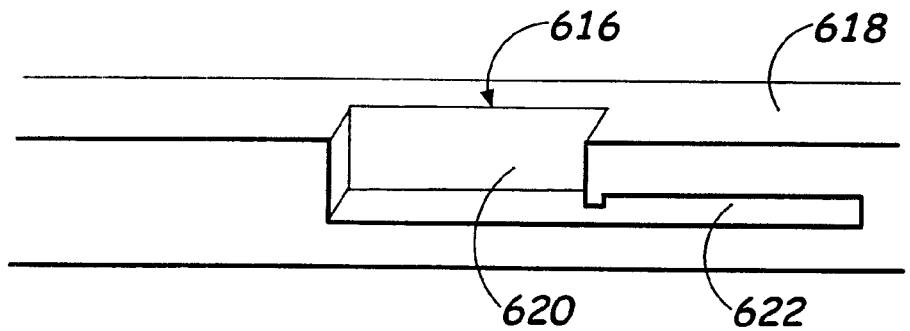

Further, a receptacle may also be formed in the topside of a frame, an example of which is shown in FIG. 6C. In this embodiment, a receptacle 616 is formed in the top of a frame 618 to enable a pressure device to be placed down through a vertical slot 620 in the frame 618 and then slid over into a retention portion 622 of the receptacle 616. In this way, a pressure device may be installed after a mounting device was attached to a circuit board over an integrated circuit.

Figure 7A:
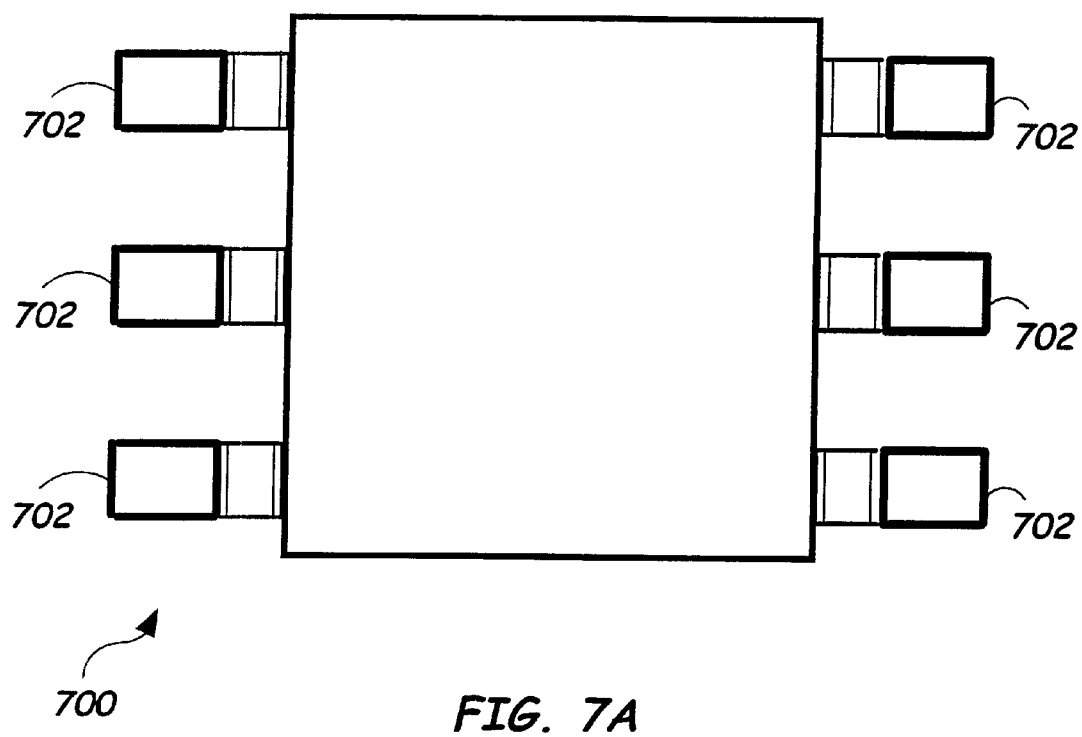
FIGS. 7A and 7B are bottom views of exemplary pressure devices of the present invention.
Figure 7B:
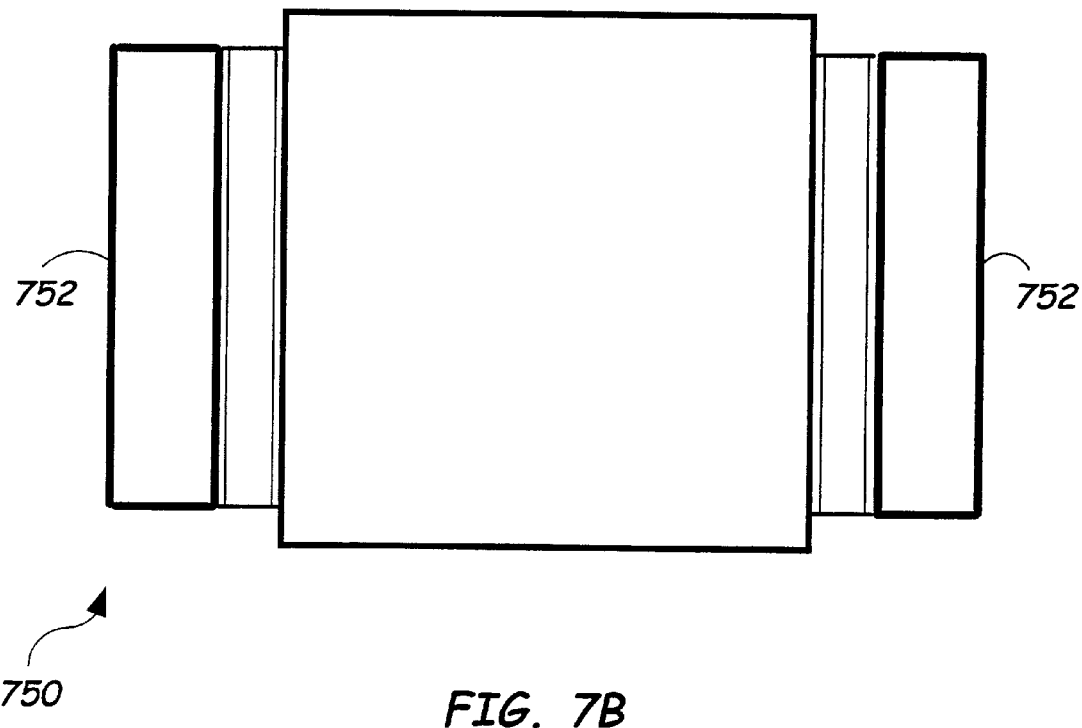

Referring now to FIGS. 7A and 7B, exemplary pressure devices suitable for providing an EMC coupling/ground paths and/or heat conduction paths are shown. A pressure device 700 may be formed as a spring clip with a plurality of tabs 702 suitable for insertion into receptacles 412 of a frame (FIG. 4). Additionally, a pressure device 750 may be formed with a tabs 752 formed so as to substantially extend along the length of the pressure device 750. Such a pressure device 750 would be suitable for a corresponding extended receptacle on a frame, and may be preferable to provide increased securing force and ease of manufacture.

Figure 8A:
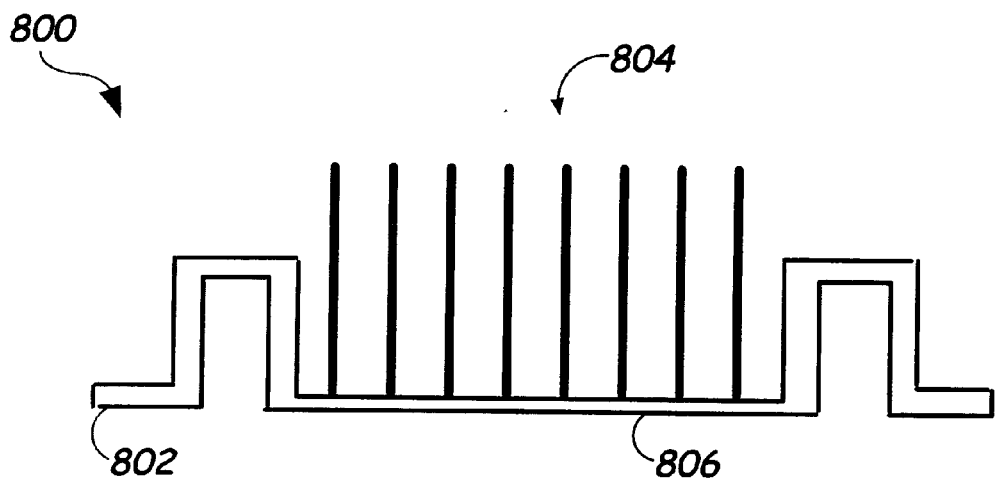
FIGS. 8A and 8B depict exemplary embodiments of the present invention wherein a heat sink may be provided in connection with an exemplary pressure device.
Figure 8B:
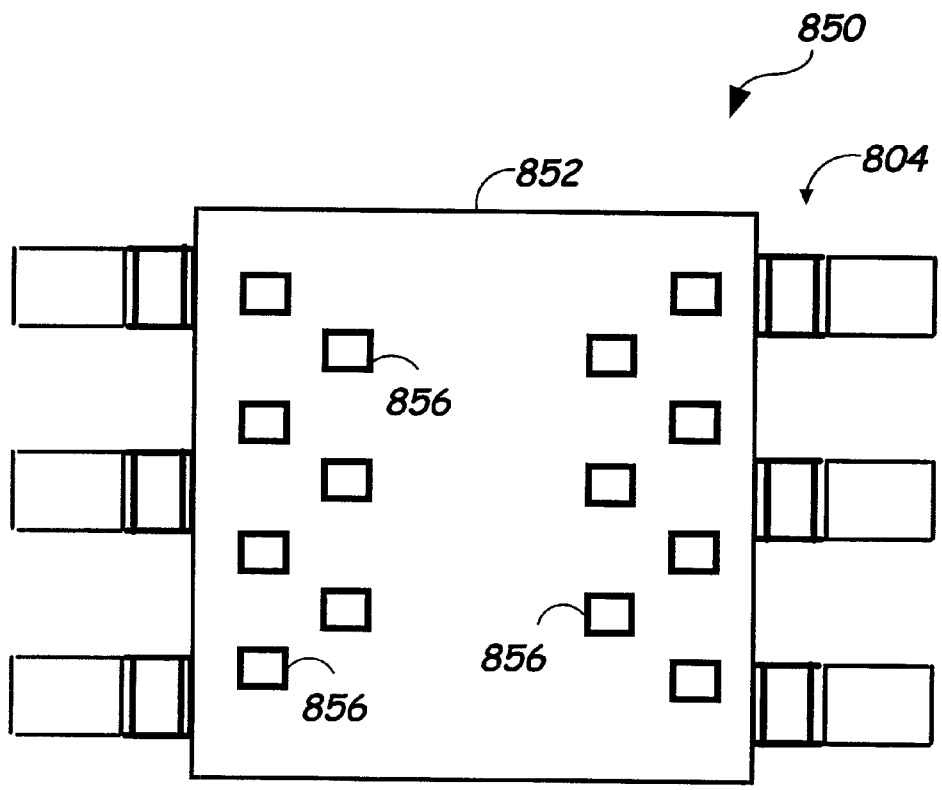

Additionally, as shown in the exemplary embodiments 800 and 850 of the present invention depicted in FIGS. 8A and 8B, pressure device of the present invention may include a heat sink. Referring now to FIG. 8A, a side view of an exemplary pressure device 802 depicts a plurality of heat sink fins 804 included on a contact portion 806 of the pressure device 802. In this way, heat conducted by the contact portion 806 from an integrated circuit may be efficiently conducted to the heat sink fins 804 for cooling. Further, as shown in FIG. 8B, a contact portion 852 of a pressure device 804 may include attachment points 856 for a removable heat sink without departing from the spirit and scope of the present invention.

It is believed that the apparatus suitable for mounting an integrated circuit (IC) of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. An apparatus suitable for mounting an integrated circuit (IC), comprising:

a frame suitable for receiving an integrated circuit (IC), the frame including at least one leg coupled to the frame, the leg suitable for engaging a circuit board so as to enable the apparatus to be secured to the circuit board, thereby securing the integrated circuit (IC) wherein at least one of the frame and leg include an embedded conductive material so as to create a heat conducting path and an EMC coupling/ground path between the integrated circuit (IC) and the circuit board.

2. The apparatus as described in claim 1, further comprising a pressure device suitable for biasing the integrated circuit (IC) configured as a ball grid array (BGA) against an electrical signal trace pad included on the circuit board.

3. The apparatus as described in claim 1, where the pressure device includes a conductive material suitable for creating at least one of a heat conducting path and an EMC coupling/ground path between the apparatus and the circuit board.

4. The apparatus as described in claim 1, wherein the pressure device including a conductive material is coupled to the conducting material included in at least one of the frame and the leg to provide a conductive path from the pressure device to the circuit board.

5. The apparatus as described in claim 4, wherein a Faraday cage effect is obtained to contain radiated EMI emissions from inside of the integrated circuit.

6. The apparatus as described in claim 1, wherein the leg includes at least one of a foot suitable for insertion into a hole on the circuit board to secure the apparatus to the circuit board; and a screw suitable for attachment to the circuit board.

7. The apparatus as described in claim 6, wherein the foot includes a split-tapered point and the hole includes a plated hole in the circuit board.

8. The apparatus as described in claim 1, wherein the pressure device includes a heat sink.

9. An apparatus suitable for mounting an integrated circuit to a circuit board, comprising:

a frame suitable for receiving the integrated circuit (IC), the frame including at least one leg coupled to the frame, the leg suitable for engaging a circuit board so as to enable the apparatus to be secured to the circuit board, thereby securing the integrated circuit (IC); and a pressure device connected to the frame, the pressure device suitable for biasing the integrated circuit to the circuit board; and wherein the pressure device and leg include an embedded conductive material to provide an EMC coupling/ground path between the integrated circuit (IC) and the circuit board.

10. The apparatus as described in claim 9, wherein the pressure device is suitable for biasing the integrated circuit (IC) configured as a ball grid array (BGA) against an electrical signal trace pad included on the circuit board.

11. The apparatus as described in claim 9, wherein the pressure device and leg provide a heat conductive path from the integrated circuit to the circuit board.

12. The apparatus as described in claim 9, wherein a Faraday cage effect is obtained to contain radiated EMI emissions from inside of the integrated circuit.

13. The apparatus as described in claim 9, wherein the leg includes at least one of a foot suitable for insertion into a hole on the circuit board to secure the apparatus to the circuit board; and a screw suitable for attachment to the circuit board.

14. The apparatus as described in claim 13, wherein the foot includes a split-tapered point and the hole includes a plated hole in the circuit board.

15. The apparatus as described in claim 9, wherein the pressure device includes a heat sink.

16. An apparatus suitable for mounting an integrated circuit to a circuit board, comprising:

a frame suitable for receiving the integrated circuit (IC), the frame suitable for engaging a circuit board so as to enable the apparatus to be secured to the circuit board, thereby securing the integrated circuit (IC);

a pressure device connected to the frame, the pressure device suitable for biasing the integrated circuit to the circuit board;

wherein the pressure device and frame include an embedded conductive material to provide at least one of an EMC coupling/ground path and a heat conductive path between the integrated circuit (IC) and the circuit board.

17. The apparatus as described in claim 16, wherein the frame includes at least one leg, the leg suitable for engaging a circuit board so as to enable the apparatus to be secured to the circuit board, thereby securing the integrated circuit (IC).

18. The apparatus as described in claim 17, wherein the leg includes at least one of a foot suitable for insertion into a hole on the circuit board to secure the apparatus to the circuit board; and a screw suitable for attachment to the circuit board.

19. The apparatus as described in claim 18, wherein the foot includes a split-tapered point and the hole includes a plated hole in the circuit board.

20. The apparatus as described in claim 16, wherein the pressure device is suitable for biasing the integrated circuit (IC) configured as a ball grid array (BGA) against an electrical signal trace pad included on the circuit board.

21. The apparatus as described in claim 16, wherein a Faraday cage effect is obtained to contain radiated EMI emissions from inside of the integrated circuit.

22. The apparatus as described in claim 16, wherein the pressure device includes a heat sink.

23. The apparatus as described in claim 1, wherein the leg includes at least one foot suitable for insertion into a hole on the circuit board to secure the apparatus to the circuit board, the foot including a conductive material to provide a heat conductive path between the integrated circuit (IC) and the circuit board.

24. The apparatus as described in claim 9, wherein the leg includes at least one foot suitable for insertion into a hole on the circuit board to secure the apparatus to the circuit board, the foot including a conductive material to provide a heat conductive path between the integrated circuit (IC) and the circuit board.

25. The apparatus as described in claim 16, wherein the leg includes at least one foot suitable for insertion into a hole on the circuit board to secure the apparatus to the circuit board, the foot including a conductive material to provide a heat conductive path between the integrated circuit (IC) and the circuit board.

* * * * *